(12) United States Patent
Zhao et al.

(10) Patent No.: US 11,830,747 B2
(45) Date of Patent: Nov. 28, 2023

(54) PLASMA REACTOR HAVING A FUNCTION OF TUNING LOW FREQUENCY RF POWER DISTRIBUTION

(71) Applicant: Advanced Micro-Fabrication Equipment Inc, China, Shanghai (CN)

(72) Inventors: Kui Zhao, Shanghai (CN); Hiroshi Iizuka, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/228,407

(22) Filed: Dec. 20, 2018

(65) Prior Publication Data

US 2019/0206703 A1 Jul. 4, 2019

(51) Int. Cl.
*H01L 21/67* (2006.01)
*H05H 1/46* (2006.01)
(Continued)

(52) U.S. Cl.
CPC .. *H01L 21/67069* (2013.01); *H01J 37/32155* (2013.01); *H01J 37/32174* (2013.01);
(Continued)

(58) Field of Classification Search
USPC ...................................................... 156/915
See application file for complete search history.

(56) References Cited

U.S. PATENT DOCUMENTS 6,095,084 A 8/2000 Shamouilian et al.
6,232,236 B1 5/2001 Shan et al.
(Continued)

FOREIGN PATENT DOCUMENTS

CN 101720501 A 6/2010
CN 103227091 A 7/2013
(Continued)

*Primary Examiner* — Ram N Kackar
(74) *Attorney, Agent, or Firm* — Womble Bond Dickinson (US) LLP; Joseph Bach, Esq.

(57) ABSTRACT

The present disclosure provides a plasma reactor having a function of tuning low frequency RF power distribution, comprising: a reaction chamber in which an electrically conductive base is provided, the electrically conductive base being connected to a low frequency RF source via a first match, an electrostatic chuck being provided on the electrically conductive base, an upper surface of the electrostatic chuck being configured for fixing a to-be-processed substrate, an outer sidewall of the electrically conductive base being coated with at least one layer of plasma corrosion-resistance dielectric layer, a coupling ring made of a dielectric material surrounding an outer perimeter of the base, a focus ring being disposed above the coupling ring, the focus ring being arranged surround the electrostatic chuck and be exposed to a plasma during a plasma processing procedure; the plasma reactor further comprising an annular electrode that is disposed above the coupling ring but below the focus ring; a wire, a first end of which is electrically connected to the base, and a second end of which is connected to the annular electrode, a variable capacitance being serially connected to the wire.

11 Claims, 7 Drawing Sheets

(51) Int. Cl.
*H01J 37/32* (2006.01)
*H01L 21/683* (2006.01)

(52) U.S. Cl.
CPC .. *H01J 37/32577* (2013.01); *H01J 37/32706* (2013.01); *H01L 21/6719* (2013.01); *H01L 21/67109* (2013.01); *H01L 21/6831* (2013.01); *H05H 1/46* (2013.01); *H05H 1/466* (2021.05); *H05H 1/4652* (2021.05); *H05H 2242/20* (2021.05)

(56) References Cited

U.S. PATENT DOCUMENTS

| | | | |
|---|---|---|---|
| 6,478,924 | B1 | 11/2002 | Shamouilian et al. |
| 7,132,618 | B2 | 11/2006 | Hoffman et al. |
| 7,193,168 | B1* | 3/2007 | Gilliland .............. H01H 35/24 200/81 R |
| 7,758,764 | B2 | 7/2010 | Dhindsa et al. |
| 8,070,911 | B2 | 12/2011 | Himori et al. |
| 8,617,351 | B2 | 12/2013 | Hoffman et al. |
| 8,904,957 | B2 | 12/2014 | Kikuchi et al. |
| 9,437,402 | B2 | 9/2016 | Kikuchi et al. |
| 9,728,381 | B2 | 8/2017 | Kikuchi et al. |
| 10,002,744 | B2 | 6/2018 | Chen et al. |
| 2003/0056901 | A1 | 3/2003 | Nakano et al. |
| 2004/0163593 | A1 | 8/2004 | Aota et al. |
| 2005/0079737 | A1 | 4/2005 | Kellerman et al. |
| 2006/0221540 | A1* | 10/2006 | Himori ............ H01J 37/32568 361/234 |
| 2007/0091006 | A1* | 4/2007 | Thober ................. H01Q 7/005 343/745 |
| 2007/0113981 | A1 | 5/2007 | Brcka |
| 2008/0236749 | A1* | 10/2008 | Koshimizu ....... H01J 37/32642 156/345.33 |
| 2010/0012274 | A1* | 1/2010 | Miyagawa ........ H01L 21/67103 156/345.37 |
| 2010/0025369 | A1* | 2/2010 | Negishi ............ H01J 37/32935 216/60 |
| 2010/0326957 | A1 | 12/2010 | Maeda et al. |
| 2011/0126405 | A1 | 6/2011 | Baek et al. |
| 2012/0216955 | A1 | 8/2012 | Eto et al. |
| 2012/0252141 | A1 | 10/2012 | Sundararajan et al. |
| 2015/0083333 | A1 | 3/2015 | Kikuchi et al. |
| 2015/0170925 | A1 | 6/2015 | Chen et al. |
| 2016/0307743 | A1 | 10/2016 | Brown et al. |
| 2017/0018411 | A1* | 1/2017 | Sriraman ......... H01J 37/32568 |

FOREIGN PATENT DOCUMENTS

| | | |
|---|---|---|
| CN | 103715049 A | 4/2014 |
| CN | 104241070 A | 12/2014 |
| TW | 506234 B | 10/2002 |
| TW | 200908063 A | 2/2009 |
| WO | 0225695 A2 | 3/2002 |

* cited by examiner low frequency RF power input P0 low frequency RF power input P0

PLASMA REACTOR HAVING A FUNCTION OF TUNING LOW FREQUENCY RF POWER DISTRIBUTION

RELATED APPLICATION

The present application claims priority to and the benefit of Chinese Patent Application No. 201711474120.5, filed on Dec. 29, 2017, and the disclosure of which is hereby incorporated herein by reference in its entirety.

FIELD

Embodiments of the present disclosure relate to the field of semiconductor processing technologies, and more particularly relate to a plasma reactor having a function of tuning low frequency RF power distribution.

BACKGROUND

An increasingly wide application of semiconductor chips is found in electronic devices, while many plasma processors are needed during the manufacturing procedure of semiconductor chips, which processors perform processing such as plasma etching and CVD (Chemical Vapor Deposition) to substrates. FIG. 1a illustrates a typical processor for plasma etching, wherein the processor comprises a reaction chamber 10 a top portion of which includes a dielectric window, an inductive coil 7 being provided above the dielectric window, the inductive coil 7 being connected to a high frequency (13 MHz and above) radio-frequency (RF) source 6 via an RF match 8; the processor further comprises at least one reactant gas source 11 which feeds the reactant gas into the reaction chamber via a valve 95 and an injector 90 to form a plasma to etch a substrate. A base 20 is provided at a lower portion of the inside space of the reaction chamber 10, the base being connected to a bias RF source 4 via a bias RF power match, wherein the frequency outputted by the bias RF source is generally below 2 MHz. A bottom portion of the reaction chamber 10 further includes a gas exhaust device to exhaust gas so as to maintain a low pressure inside the reaction chamber, and a valve 3 tuning an internal pressure by tuning an openness degree of the valve. The base 20 is usually made by surface anodized aluminum alloy, or by coating a layer of corrosion-resistance dielectric material on the surface of the aluminum alloy, so as to avoid corrosion by an etching gas in the reaction chamber, which would otherwise cause a series of problems such as particle contamination. An electrostatic chuck 21 is provided at an upper surface of the base, for fixing the substrate 22 to the upper surface of the electrostatic chuck. A raised step is further provided at a lower sidewall of the base, and a coupling ring 25 is provided on the step, wherein distribution of RF energy coupled to a substrate edge area is changed based on the material and shape of the coupling ring 25 as selected. A focus ring 23 is provided above the coupling ring 25, wherein an inner wall of the focus ring 23 surrounds and closely approaches the substrate 22; and an upper surface of the focus ring 23 is exposed to the plasma above. During the plasma processing process, a bias RF power is used for controlling the thickness of a sheath formed on the upper surface of the substrate and the focus ring, wherein the thicknesses of the sheath determines energy and direction of the ions in the plasma incident to the substrate. If the sheath of the substrate edge area and the sheath of the focus ring are not continuously distributed, the etching speed and etching direction in the substrate edge area (edge tilting) would be caused inconsistent with those in the substrate central area, which deteriorates the uniformity of substrate processing and lowers the yield of final chips.

Because the focus ring 23 is retained in a plasma filled with an etching gas for a long term, the surface material of the focus ring 23 will be surely corroded after being subjected to plasma processing for a certain duration, and the height of the upper surface of the focus ring will also decrease accordingly; the decreased height will seriously affect the distribution and modality of the sheath in the substrate edge area; to compensate the plasma processing result drift occurring during long-term working, a corresponding compensation mechanism or method needs to be devised. In some prior arts, an annular cavity is provided inside the coupling ring 25 or the focus ring, and dielectric fluid is introduced in the cavity, so as to tune a bias RF power distributed above the focus ring by tuning the amount or composition of the dielectric fluid, thereby compensating the processing result drift caused by height change of the focus ring. However, this method requires providing a dielectric fluid supply pipeline inside the reaction chamber and further providing a hermetic cavity inside the components such as couple ring or focus ring; besides, it's difficult to measure the height of dielectric fluid level when employing this method; therefore, in industry practice, this method will result in a higher complexity in structures of components and a higher cost; moreover, it is very difficult to perform precise and fine tuning to electric field distribution. In some other prior arts, a mechanical driving device is provided in the reaction chamber to drive the coupling ring 25 or the focus ring 23 to move finely up or down so as to change the electric field distribution in the substrate edge area. However, this method will cause particle contamination to movable parts; besides, it is also hard to precisely locate the coupling ring 25 and focus ring 23 in movement, where a location displacement even under 1 mm will result in nonuniform processing distribution processing result. Besides their own problems, the two tuning methods above also have a most serious common defect: they have little effect on the low frequency RF power coupled to the focus ring 23, and to effectively improve power distribution, a large-amplitude tuning is necessary. As shown in FIG. 1b, the input low frequency RF power P0 passes through an equivalent capacitance C11 between a base 20 and a substrate 22 to couple power P1' to the substrate, and meanwhile passes through an equivalent capacitance C12 derived from the capacitances of the base 20 through the coupling ring 25 to the focus ring 23, where the value of the C12 is very small and not easily tunable, such that P2' would be far smaller than P1' and a ratio between the powers cannot be tuned easily. To increase the C12, a highly electrically conductive material such as aluminum and silicon carbide may be selected to manufacture the coupling ring 25. However, such a compensating approach through material selection can only compensate for a certain period, which cannot dynamically compensate the processing result drift caused by consuming of the focus ring.

Therefore, a new tuning apparatus is desired in the industry, so as to finely and precisely tune low frequency RF power distribution in substrate center and edge areas, thereby improving the uniformity of substrate processing technique. Most preferably, the tuning apparatus is required to have a simple structure and a low cost and be applicable to various plasma processing equipment.

SUMMARY

Embodiments of the present disclosure provide a plasma reactor having a function of tuning low frequency RF power distribution, comprising: a reaction chamber in which an electrically conductive base is provided, the electrically conductive base being connected to a low frequency RF source via a first match, an electrostatic chuck being provided on the electrically conductive base, a coupling ring being arranged to surround an outer perimeter of the electrically conductive base, a focus ring being disposed above the coupling ring, the focus ring being arranged to surround the electrostatic chuck and to be exposed to a plasma during a plasma processing procedure; the plasma reactor further comprising an annular electrode disposed above the coupling ring; an electrically conductive connection portion, the electrically conductive connection portion comprising at least one wire, a first end of the wire being electrically connected to the electrically conductive base or electrically connected to an intermedia conductive part electrically coupled to the electrically conductive base, a second end of the wire being electrically connected to the annular electrode, a variable impedance device being serially connected to the wire, a hermetic baffle plate being provided below the electrically conductive base, the variable impedance device being mounted in a mount space below the hermetic baffle plate and above the reaction chamber bottom wall; the variable impedance device comprises a plurality of capacitors having a preset capacitance value and a plurality of switches, wherein switching of the plurality of switches may cause the variable impedance device to have different capacitance values.

The present disclosure further provides another embodiment: a plasma reactor having a function of tuning low frequency RF power distribution, comprising: a reaction chamber in which an electrically conductive base is provided, the electrically conductive base being connected to a low frequency RF source via a first match, an electrostatic chuck being provided on the electrically conductive base, a coupling ring being arranged to surround an outer perimeter of the electrically conductive base, a focus ring being disposed above the coupling ring, the focus ring being arranged to surround the electrostatic chuck and to be exposed to a plasma during a plasma processing procedure; the focus ring being made of a conductor or a semiconductor material; the plasma reactor further comprises at least one wire, a first end of the wire being electrically connected to the electrically conductive base or electrically connected to an intermedia conductive part electrically coupled to the electrically conductive base, a second end of the wire being electrically connected to focus ring, a variable impedance device being serially connected on the wire; a hermetic baffle plate being provided below the electrically conductive base, the variable impedance device being mounted in a mount space below the hermetic baffle plate and above the reaction chamber bottom wall; the variable impedance device comprises a plurality of capacitors having a preset capacitance value and a plurality of switches, wherein switching of the plurality of switches may cause the variable impedance device to have different capacitance values.

In the two embodiments above, a step is provided below an outer perimeter of the electrically conductive base, the electrically conductive portion is disposed above the step of the electrically conductive base, the coupling ring is made of an insulative material and disposed above the electrically conductive portion, and an outer sidewall of the electrically conductive base includes at least one layer of plasma corrosion-resistance insulative layer.

In the two embodiments above, the frequency outputted by the low frequency RF power source is less than 2 Mhz.

The focus ring is made of an insulative material; the annular electrode is buried in the focus ring, or the annular electrode is buried in an upper half portion in the coupling ring.

In the two embodiments above, a plurality of capacitors and a plurality of switches are provided on the PCB circuit board. Preferably, the plurality of capacitors have different capacitance values, and the plurality of switches are pneumatic switches.

The present disclosure further provides a method of tuning a low frequency RF power distribution, which is applied to the two plasma reactors above, comprising steps of: Step of Monitoring a Substrate Etching Result: detecting an etching result in substrate edge area; in the case that a tilt angle of an etched hole in the substrate edge area is within a preset angle range, continuing to execute the Step of Monitoring the Substrate Etching Result; and in the case that the tilt angle of the etched hole in a substrate edge area exceeds the preset angle, entering a Step of Tuning a Variable Impedance; and Step of Tuning a Variable Impedance: tuning switching states of the plurality of switches, changing the low frequency RF power applied to a focus ring, and return to the Step of Monitoring the Substrate Etching result.

DETAILED DESCRIPTION OF EMBODIMENTS

Figure 2:
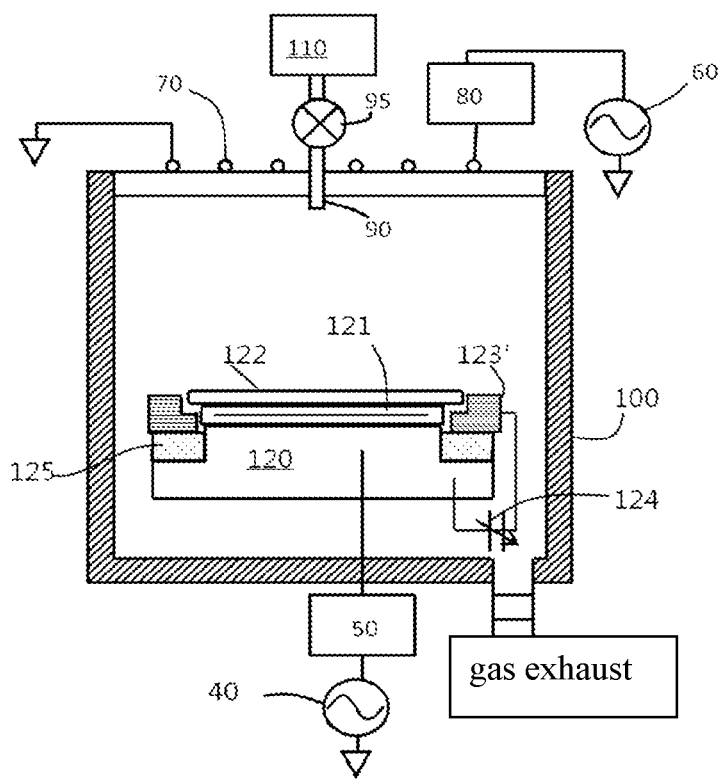
FIG. 2 is a schematic diagram of a plasma processor of an embodiment in the present disclosure.

Hereinafter, a preferred embodiment of the present disclosure will be further illustrated with reference to FIG. 2.

Through researching, the inventors find that when a high frequency RF power is inputted in a base 120, the RF power can be easily coupled to the focus ring, because for a high frequency signal, the thin (tens of microns) dielectric corrosion-resistance layer at a surface of the base 120 and the coupling ring 125 have a very small impedance. However, for a low frequency RF signal, a lower frequency causes a large impedance for the same dielectric layer and the coupling ring 125, and this impedance results in that only very little low frequency energy can be coupled to the focus ring 123, such that no matter what solutions are employed to tune the dielectric constants and positions of the coupling ring and the focus ring, the final tunable scope is still very limited. Because the dielectric corrosion-resistance layer at the sidewall of the base 120 is indispensable and the coupling ring is always made of a dielectric material such as aluminum oxide or silicon oxide, it is impossible to tunably distribute the low frequency RF power to the focus ring 123 at the substrate edge without hardware improvement; although the coupling ring may also be made of a highly electrically conductive material, such a coupling ring can only achieve a relatively good etching effect in a short term, and as the time elapses, it still cannot compensate the processing result drift caused by consuming of the focus ring. Moreover, besides affecting the distribution of low frequency RF power, the highly electrically conductive coupling ring also affects distribution of the high frequency RF power distribution; therefore, tuning of the thickness of the sheath above the focus ring undesirably causes nonuniform distribution of plasma density, which cannot improve the overall plasma processing result either. The focus ring 123 is usually made of a dielectric material such as quartz and aluminum oxide or a semiconductor material such as silicon carbide and silicon so as to avoid the substrate from being contaminated by the particles produced during the plasma processing process while providing sufficient electrical conductivity.

Figure 1A:
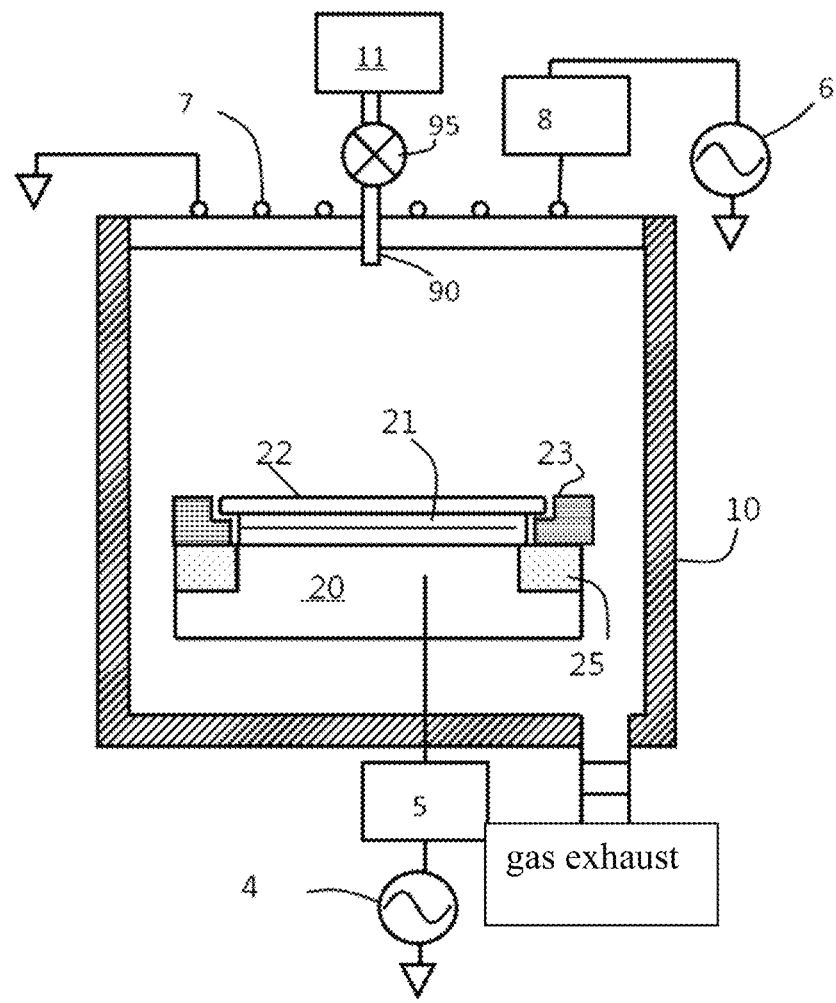
FIG. 1a is a schematic diagram of a plasma processor in the prior art.
Figure 2A:
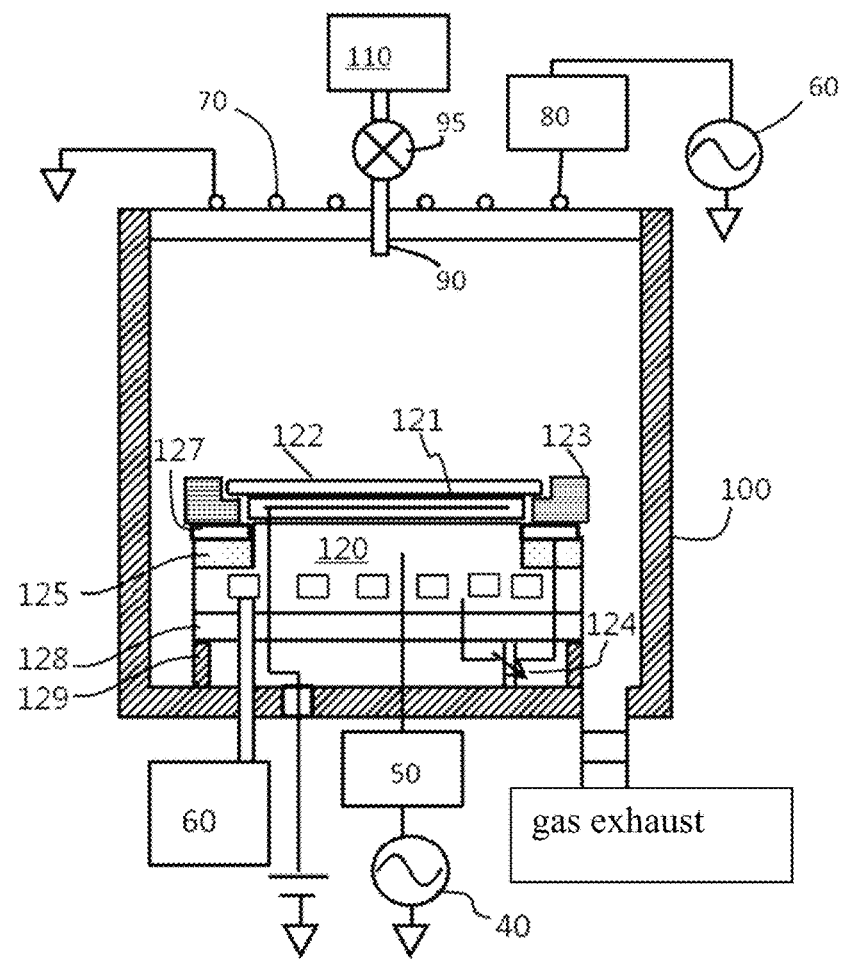
FIG. 2a is a schematic diagram of a plasma processor in the present disclosure.

Based on this finding, the present disclosure provides a novel plasma processing chamber shown in FIG. 2a, whose basic structure is identical to the prior art shown in FIG. 1a, except that an electrically conductive connector is applied for transmitting the low frequency RF power, wherein the electrically conductive connector is typically a wire, the wire being directly extended till above the coupling ring but below the focus ring and meanwhile a variable capacitance 124 being serially connected on the wire. As shown in FIG. 2a, an annular electrode 127 is disposed above the coupling ring 125 and the focus ring is disposed on the annular electrode; a first end of the wire is directly electrically connected to the annular electrode 127, the other end thereof is directly electrically connected to the base 120, and a variable capacitance 124 is serially connected on the wire, such that the low frequency RF power transmitted to the focus ring is tuned by tuning a capacitance value of the variable capacitance 124. The annular electrode 127 may be made of any electrically conductive material, e.g., aluminum, graphite, etc., as long as the material may provide a good electrical conductivity. The variable capacitance of the present disclosure may be disposed in a vacuum space below the electrically conductive base 120; most preferably, the variable capacitance 124 is disposed in an atmospheric environment below the hermetic baffle plate in the reaction chamber, only required to allow the two ends of the wire to pass through the hermetic baffle plate and fix the two ends in RF hot region; disposing the variable capacitance in the atmospheric environment facilitates heat dissipation and maintenance. A reaction chamber wall 100 is formed by a grounded metal, the grounded metal forming an electric field shielding space, such that as long as the variable capacitance 124 is disposed within the electric field shielding space of the reaction chamber, even it is in the atmospheric environment below the hermetic baffle plate, radiation of a low frequency electric field from the variable capacitance 124 to the external environment may still be avoided. Below the hermetic baffle plate 128 is provided a mount space, enclosed by the support sidewall 129, the hermetic baffle plate 128, and a reaction chamber bottom wall; various hardware required by processing the plasma process chamber is mounted within the mount space; such hardware is disposed in an atmosphere environment but exposed to the RF power. Compared with the prior art in which a fluid inlet and outlet pipeline and a mechanical driving device are required in the vacuum reaction chamber, the variable capacitance in the present disclosure not only has a small size and a low cost, but also has a simple mechanical structure.

The hermetic baffle plate 128 in the present disclosure is further provided with a large number of holes, such that various kinds of gas, liquid, and electric cable may pass through the atmosphere into the base 120 inside vacuum space to play their respective effects. For example, a pipeline for circulation of coolant, from a coolant container 60 outside of the reaction chamber, through the hermetic baffle plate 128, into the coolant channel in the base 120; these evenly distributed coolant channels enable the base to maintain an optimal temperature. The RF power outputted by the RF power supply 40 is subject to impedance tuning by a match circuit in the match 50, causing the RF power to enter the base 120 through the hermetic baffle plate 128 via a cable. The high voltage outputted by the high voltage DC power supply is also needed to pass through the hermetic baffle plate and connect the electrode in the electrostatic chuck 121 via the wire, making the wafer 122 fixed on the electrostatic chuck. besides, a cooling gas (helium) pipeline for cooling the wafer 122 is also needed to pass through a space below the hermetic baffle plate; a heater disposed above the base 120 is also needed to receive a heating power, such that a heater wire is also needed to provide; meanwhile, a detector for detecting a temperature inside the heater may also be provided; the detected temperature signals in different areas are transmitted to a controller in an external atmosphere via a wire. After completion of processing of the wafer 122, the wafer is also needed to be lifted, such that a plurality of lift pins need also be disposed below the base or the hermetic baffle plate 128. All of the various essential mechanisms need to occupy respective spaces, such that the variable capacitor 124 according to the present disclosure allows a very limited occupied space. The variable capacitor, which is a core component in the match 50, is generally a vacuum capacitor, which needs an integrated motor to drive multiple electrically conductive devices to make an accurate position movement, such that the capacitor is continuously tunable within a very large range so as to match continuously changing impedance in the plasma process chamber. Therefore, the variable capacitor in the match needs a very large volume and a very high cost, which can only be disposed outside of the reaction chamber 100. The variable capacitor 124 in the present disclosure usually does not need to frequently change a capacitance value; the variable capacitance 124 is only needed to be tuned for compensation only after a long-term plasma processing causes attribute drift of the focus ring 123; therefore, the variable capacitor 124 of the present disclosure is not required to be continuous tunable within a very large range, which only needs to tune a certain numerical value of the capacitance only after a certain interval, thereby improving the uniformity of a plasma processing effect.

Figure 6A:
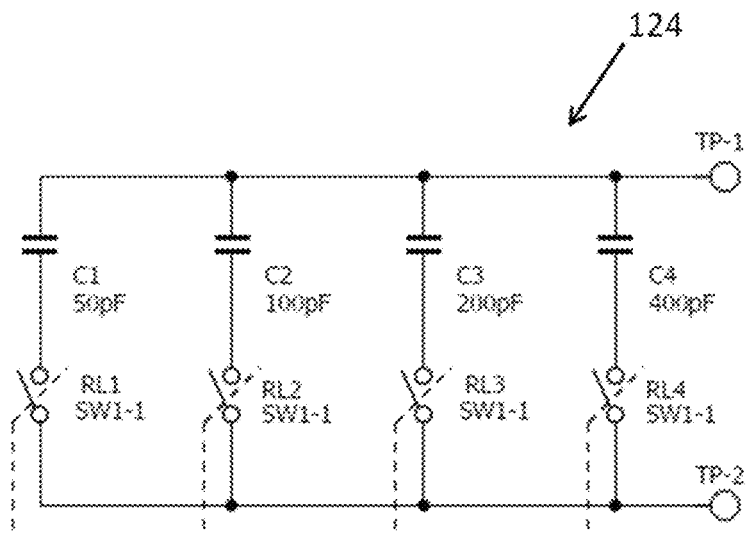
FIG. 6a is a circuit structure schematic diagram of a variable capacitor in a plasma processor according to the present disclosure.

The application environment of the variable capacitor based on the present disclosure is a narrow mount space, the function of which is to tune the capacitance value after a certain interval. The present disclosure proposes a variable capacitance circuit 124 shown in FIG. 6a. The variable capacitance circuit 124 according to the present disclosure comprises a plurality of capacitors C1~C4 with fixed capacitance values of 50 pf, 100 pf, 200 pf, and 400 pf, respectively. A switch RL1~RL4 is further serially coupled on each capacitance C1~C4; a plurality of branch circuits formed by serial connected capacitors and switches, these branch circuits are parallel connected to each other; a second end TP-2 is electrically connected to the base 120; a first end TP-1 is connected to an electrically conductive ring 127. By changing the open or closed state of the switches RL1~RL4, the output capacitance value of the variable capacitance circuit 124 may be changed, such that the output capacitance of the variable capacitance circuit 124 is tunable. Besides the value selections above, the capacitance value of each capacitor C1~C4 may also be other value, e.g., 20 pf~200 pf, which may be selected based on the needs of the capacitance value to be compensated when the focus ring is corroded. The number of fixed capacitors may be four or other number, e.g., 5 or 3, as long as the capacitance of the variable capacitance circuit 124 that can be tuned in multiple levels may satisfy the needs of the present disclosure. The variable capacitance circuit is formed by parallel connection of a plurality of branches, and the present disclosure may also set serially connected branch circuits, e.g., serially connected C3 and C4 are connected between the first end and the second end; a by-pass switch is parallel connected at two ends of the C4, such that only C3 capacitance works when the by-pass switch is closed, and when the by-pass switch is opened the serial capacitance of C4 and C4 couple to the whole variable capacitance circuit 124. The variable capacitance circuit 124 of the present disclosure may also be any variable capacitance network formed by serial-parallel combination, such that tuning of the entire capacitance network value may be implemented only by controlling the switch therein.

Figure 6B:
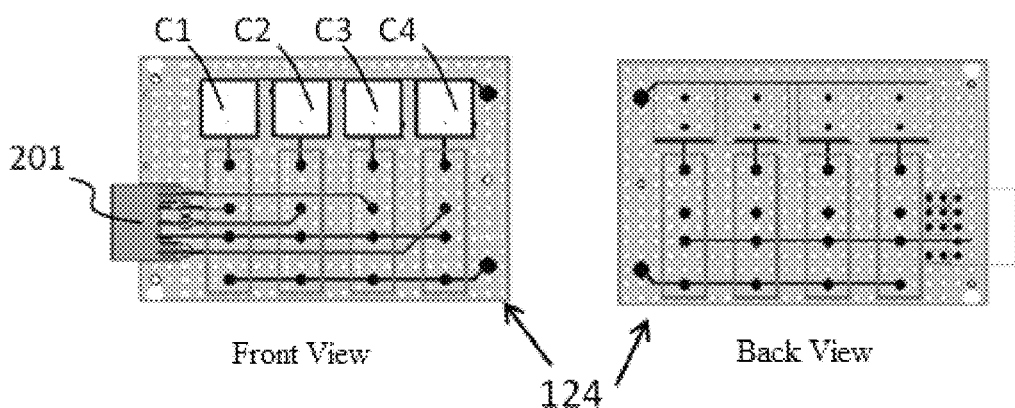
FIG. 6b is a schematic diagram of an actual shape of a variable capacitor in a plasma processor according to the present disclosure.

The plurality of fixed capacitors C1-C4 and switches RL1-RL4 may be mounted on a PCB circuit board so as to save the space, e.g., the variable capacitance 124 mounted on the PCB board as shown in FIG. 6b, wherein a plurality of capacitors and switches, as well as a driver 201, are included in the front view; an electrical connection manner of different components is displayed at the back view. By simply integrating a plurality of fixed capacitors and switches on one PCB board, the size of the variable capacitance circuit of the present disclosure may be smaller than 6 cm, far less than the volume and cost of the vacuum variable capacitor in the prior art.

Because the variable capacitance in the present disclosure is located in the RF power radiation region, the switches RL1~RL4 are driven by electrical signals, the input control drive signal is an electrical signal, and a filter is further set so as to prevent the RF power from being conducted outside of the reaction chamber via a driving line. Preferably, the switches RL1~RL4 are selected as pneumatic switches, each pneumatic switch receiving a pneumatic switch signal via a hollow insulation pipeline. The hollow insulation pipeline passes through a reaction chamber bottom wall at the bottom part or a support sidewall 129 to be connected to the external controller; the switch control signal outputted by the controller is converted into a pneumatic signal and a control signal is transmitted via the insulation pipeline, causing the switch to act, finally changing the capacitance value of the variable capacitance circuit. Because no conductor is present in the insulation pipeline, an additional assistance device such as a filter is not needed, thereby further saving the space and reducing the cost.

Figure 2B:
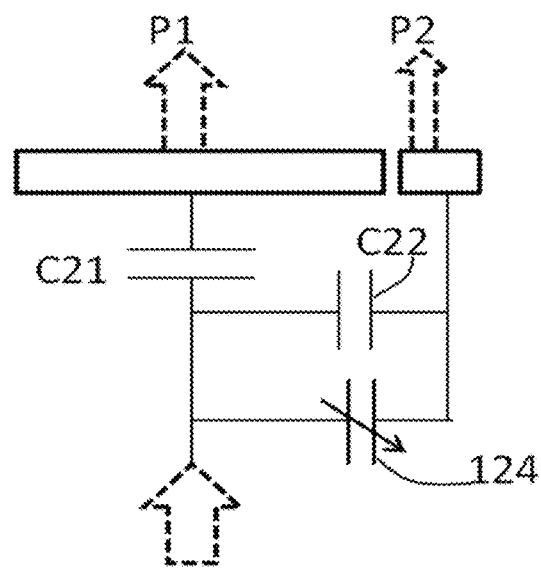
FIG. 2b is a schematic diagram of distributions of medium and low frequency RF powers in a plasma processor of the present disclosure.

FIG. 2b shows an equivalent circuit diagram and an RF power distribution diagram of the present disclosure. In the present disclosure, the equivalent capacitance C21 coupled to the substrate center is still large, such that the main power can be coupled to the substrate, but the equivalent capacitance C22 derived from the capacitances of the base 120 through a sidewall corrosion-resistance dielectric layer and the coupling ring 125 to the focus ring 123 is still very small, which cannot transport a relatively large RF power. The variable capacitance 124 does not transport the RF power in a traditional coupling manner; instead, it directly conducts the RF power in the base 120 to a lower surface of the target focus ring 123 in a direct electrical connection manner, thereby bypassing the impedance that seriously affects low frequency RF power coupling, wherein the variable capacitance 124 may adaptively select a value range and a tuning range according to needs; therefore, by simply tuning the capacitance value, the variable capacitance 124 of the present disclosure may effectively tune the low frequency RF power transmitted to the focus ring 123. When the reaction chamber is in an initial state, the variable capacitance is at an initial value; after a long-time plasma processing, when it is detected that the processing result in the substrate edge area is different from the center, the controller may real-time automatically change the capacitance value of the variable capacitance based on a set parameter, such that more low frequency RF power is transmitted to the focus ring at the substrate edge, further raising the sheath at the focus ring, making the sheath in substrate edge area and above the focus ring have the same height, thereby improving etching uniformity. A typical defect of the processing result is the edge tilting of the etching hole in the substrate edge area. Once the upper surface of the focus ring consumed causes decreasing of the height and correspondingly thinning of the sheath in the edge area, the etching hole in the substrate edge area will have an inward tilting angle. The substrate processing result is continuously detected until the uniformity of processing result deviates again from a preset threshold, and then the capacitance value of the variable capacitance is re-tuned based on the detected data. In this way, the present disclosure may prevent frequent replacement of the focus ring in a long term and maintain a stable plasma processing result only by changing parameters of the variable capacitance without a need of providing a fluid pipeline or mechanical driving means in the vacuum environment.

Figure 1B:
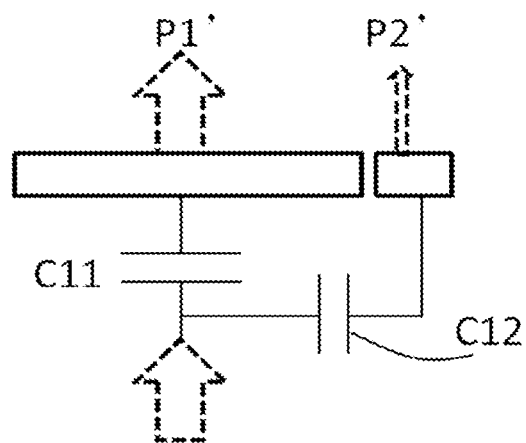
FIG. 1b is a schematic diagram of distribution of medium and low frequency RF powers in a plasma processor in the prior art.

Besides the inductively-coupled plasma (ICP) processor shown in FIGS. 1~2, the present disclosure may also be applied to a capacitively-coupled plasma (CCP) processor, where what is provided on top of the reaction chamber of the capacitively-coupled plasma processor is not a dielectric window, but an electrically conductive upper electrode in a flat shower head shape, via which upper electrode the reactant gas is fed to a reaction area below. The high frequency RF power (13 MHz above, e.g., 27 MHz, 60 MHz) may be transported to the base 120 serving as a lower electrode; at this point, the upper electrode is grounded; alternatively, the high frequency RF power may also be transported to the upper electrode. In the CCP reactor, the dielectric parameters of the coupling ring and the focus ring will simultaneously affect distributions of high frequency and low frequency RF powers; however, with the electrical conduction path provided in the present disclosure, the high frequency RF power is mainly transmitted to the focus ring 123 by way of coupling, while part of the low frequency power is coupled to the focus ring 123 via the coupling ring 125, and the other part thereof, which is tunable, is transmitted to the focus ring 123 by way of direct conduction; therefore, the present disclosure further has a function of separately tuning the high frequency and low frequency RF powers, so as to more accurately tune the plasma density distribution (high frequency power dominated) and sheath distribution (low frequency power dominated) from the center to the edge of the upper surface of the substrate.

Based on the prior art setting which only utilizes the coupling ring to couple the low frequency RF energy, the present disclosure additionally provides a low frequency RF energy supply circuit whose structure is simple and whose power is tunable. The equivalent capacitance C22 of the lower electrode coupled to the focus ring via the coupling ring and the variable capacitance 124 additionally provided by the present disclosure jointly determine the low frequency RF power distributed to the focus ring, wherein the coupling ring may be preferably made of a dielectric material; in this way, the C22 is relatively small, but added with the additional variable capacitance 124, the capacitance tuning range may be much broader. If the coupling ring 125 is made of a highly electrically conductive material, the present disclosure may be still effective, except that the tuning range for the equivalent capacitance of C22 plus 124 is slightly different.

The dielectric layer has a very large impedance to the low frequency RF signal, such that even a very thin plasma resistance coating (formed by A1203 or Y203) will appreciably affect the power for coupling the low frequency RF power to the focus ring at the substrate edge. As parameter combinations of the thickness and composition of the dielectric coating layer and the coupling ring vary, their impedances to corresponding RF frequencies are also different. RF power in specific frequency band cannot be effectively transmitted to the focus ring. Particularly, in the case of a larger thickness or a higher coupling ring dielectric coefficient, the specific frequency band will be moved to a higher frequency band. Therefore, the low frequency RF signal in the present disclosure is usually lower than 2 MHz, and the effect is most appreciable particularly when lower than 1 MHz, e.g., 400 KHz. However, as long as an application circumstance requires, an RF signal higher than 2 MHz, e.g., 13 MHz, may also adopt connection wires of the present disclosure, causing the low frequency RF power to be transmitted to the focus ring in an effective and tunable manner.

Figure 3:
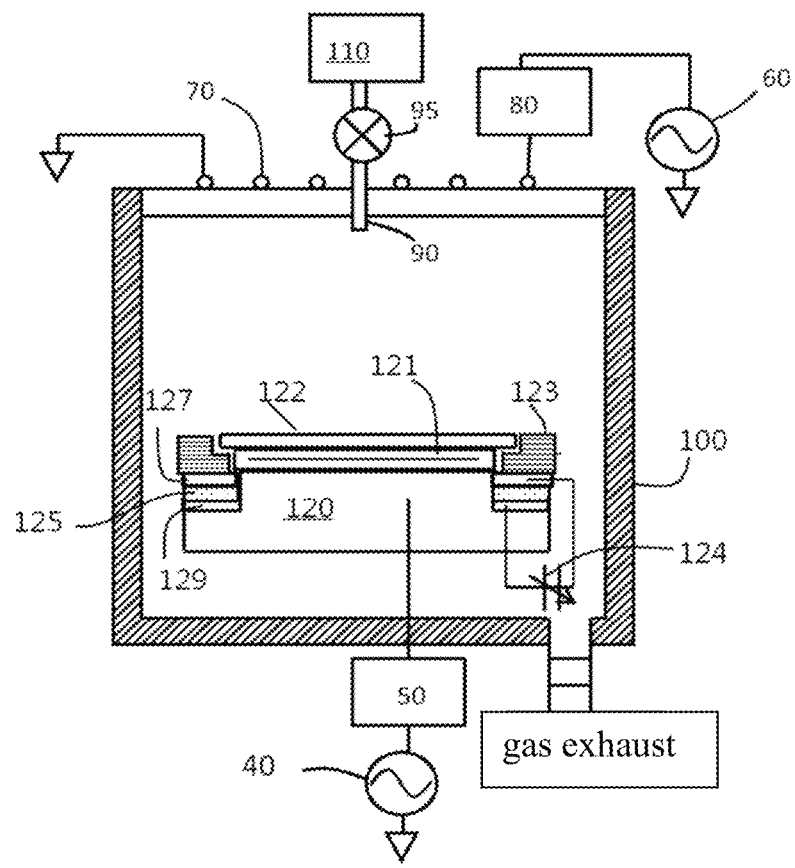
FIG. 3 is a schematic diagram of another embodiment of a plasma processor in the present disclosure.

As illustrated in FIG. 3, the present disclosure further provides another embodiment, the basic structure of which is identical to the first embodiment shown in FIG. 2, except that besides being directly connected to the lower electrode 120 via a wire, the variable capacitance 124 may also be connected to an intermedia conductive part 129 which is made of an electrically conductive material and disposed above the upper surface of a step of the lower electrode 120 and below the coupling ring 125; the low frequency RF power of the lower electrode is inputted to the intermedia conductive part 129 by coupling the dielectric layer crossing the upper surface of the step, and then is transported to the annular electrode 127 via the wire and the variable capacitance 124, wherein the electrical conductive part, which may be annular or may include a plurality of separate conductors, surrounds the lower electrode sidewall. In a plasma processing apparatus, the electric field inputted to the lower electrode is mainly upward coupled to a top portion of the reaction chamber. In the prior art, the equivalent capacitance C12 laterally coupled to the focus ring 123 from the lower electrode is very small; however, in the present disclosure, the intermedia conductive part 129 is a conductor extending in a horizontal direction, such that a large number of upward electric field lines from the step of the lower electrode may pass through the dielectric corrosion-resistance layer at the top surface of the step to reach the electrically conductive part; therefore, the equivalent capacitance is far larger than C12 in the prior art. Accordingly, in the second embodiment of the present disclosure, by providing the intermedia conductive part 129 coupled to the electric field on the top surface of the step, the low frequency electric field may be extended to the annular electrode 127 above the coupling ring 125, so as to tune the low frequency RF energy in the substrate edge area.

Figure 4:
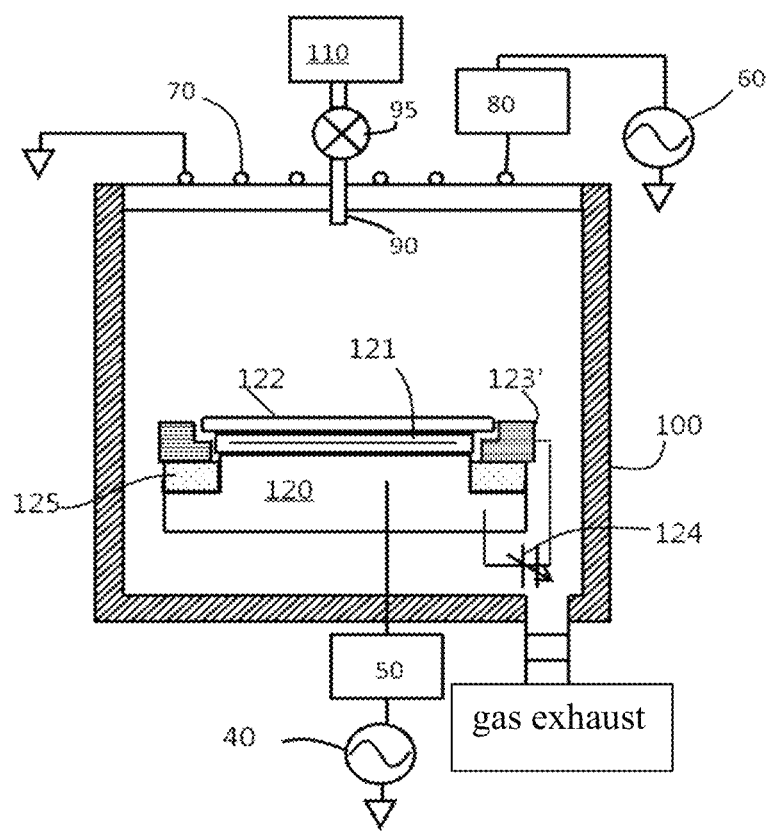
FIG. 4 is a schematic diagram of a third embodiment of a plasma processor in the present disclosure.
Figure 5:
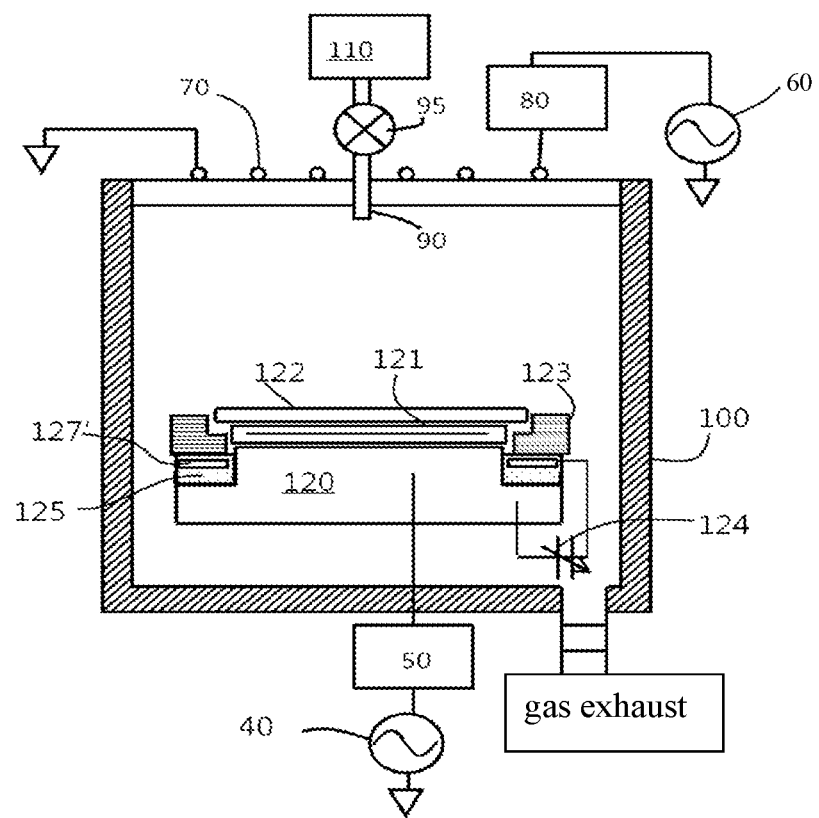
FIG. 5 is a schematic diagram of a fourth embodiment of a plasma processor in the present disclosure.

In the present disclosure, a lower end of the wire may be directly electrically connected to the electrically conductive base 120 or coupled to the intermedia conductive part 129 of the electrically conductive base. On the other hand, besides connected to the annular electrode between the coupling ring 125 and the focus ring 123, the annular electrode may also be embedded in the focus ring 123, or as shown in the embodiment of FIG. 5, an annular electrode 127' is embedded in an upper half portion of the coupling ring 125 made of a dielectric material, such that although the equivalent capacitance coupled to the focus ring 123 from the lower electrode 120 is smaller than a value of the variable capacitance 124 shown in FIG. 2, it is still far larger than C12 in the prior art shown in FIG. 1, such that the object of the present disclosure may also be achieved. As shown in the embodiment of FIG. 4, when a focus ring 123' is made of a conductor or semiconductor material (silicon, silicon carbide, aluminum, etc.), the focus ring 123' per se may serve as the annular electrode of the present disclosure, such that at this point, the upper end of the wire may be directly connected to the focus ring 123'.

Besides, the electrically conductive connector may also comprise a plurality of branch wires, and preferably, the plurality of branch wires are uniformly and symmetrically distributed in an outer peripheral of the base, such that each branch wire and its adjacent branch wires are spaced with a same distance but connected to different areas of the annular electrode. Hereinafter, another embodiment of the present disclosure will be illustrated with an example of 3 branch wires, where one end of each branch wire is connected to the annular electrode, and the other end thereof is commonly connected to a variable capacitance, and then connected to the base via the wire connected to the variable capacitance. Or, two ends of each branch wire are both connected to the electrically conductive base and the annular electrode, three independently tunable variable capacitance are serially connected to the three branch wires, and by tuning the three variable capacitance, the low frequency power may be uniformly distributed on the annular electrode from the three branch wires. Further, the annular electrode may be partitioned into three segments of arc-shaped electrically conductive plates which jointly form the annular electrode, wherein a gap or an insulating part is present between every two arc-shaped electrically conductive plates to thereby implement mutual electrical insulation; and by tuning the three variable capacitance, sheath thicknesses of different areas on the focus ring may be tuned area by area, thereby solving the problem of nonuniform sheath at some azimuths in the substrate edge annular area.

The variable capacitance in the present disclosure is only a best mode, and any other variable impedance devices that may tune the impedance of the low frequency power, including a hybrid circuit comprising a variable inductor and a capacitance arrangement, or a circuit formed by combination of other elements, may perform the function of impedance tuning. Such alternatives are common knowledge in the industry and thus will not be listed one by one.

Although the contents of the present disclosure have been described in detail through the foregoing preferred embodiments, it should be understood that the description above shall not be regarded as limitations to the present disclosure. After those skilled in the art have read the contents above, many modifications and substitutions to the present disclosure are all obvious. Therefore, the protection scope of the present disclosure should be limited by the appended claims.

The invention claimed is:

1. A plasma reactor having a function of tuning low frequency RF power distribution, comprising:
    a reaction chamber in which an electrically conductive base is provided, the electrically conductive base being connected to a low frequency RF source via a first match, an electrostatic chuck being provided on the electrically conductive base, an upper surface of the electrostatic chuck being configured for fixing a substrate, a coupling ring being arranged to surround an outer perimeter of the base, a focus ring being disposed above the coupling ring, the focus ring being arranged to surround the electrostatic chuck and to be exposed to a plasma during a plasma processing procedure;
    an annular electrode that is disposed above the coupling ring;
    an electrically conductive connector, the electrically conductive connector comprising at least one wire, wherein a first end of the wire is electrically connected to the electrically conductive base, and a second end of the wire is connected to the annular electrode, wherein a variable impedance device being serially connected on the wire, the electrically conductive connector also comprising a plurality of branch wires, wherein the plurality of branch wires are uniformly and symmetrically distributed in an outer peripheral of the base, such that each branch wire and its adjacent branch wires are spaced with a same distance but connected to different areas of the annular electrode; and
    a hermetic baffle plate is provided below the electrically conductive base, the variable impedance device being mounted in a mount space below the hermetic baffle plate and above the reaction chamber bottom wall, wherein the hermetic baffle plate and the bottom wall form an electric field shielding space in an atmospheric environment; the variable impedance device comprises a plurality of capacitors having a preset capacitance value and a plurality of switches, wherein switching of the plurality of switches may cause the variable impedance device to have different capacitance values, and
    wherein the low frequency RF source and the first end of the wire are electrically connected to the electrical conductive base but electrically isolated from the hermetic baffle plate.

2. The plasma reactor according to claim 1, wherein the frequency outputted by the low frequency RF power supply is less than 2 Mhz.

3. The plasma reactor according to claim 1, wherein the annular electrode is disposed below the focus ring.

4. The plasma reactor according to claim 1, wherein the focus ring is made of a dielectric material, and the annular electrode is embedded in the focus ring.

5. The plasma reactor according to claim 1, wherein the plurality of capacitors and the plurality of switches are disposed on a PCB circuit board.

6. The plasma reactor according to claim 1, wherein the plurality of capacitors have different capacitance values, and the plurality of switches are pneumatic switches.

7. A plasma reactor having a function of tuning low frequency RF power distribution, comprising:
    a reaction chamber in which an electrically conductive base is provided, the electrically conductive base being connected to a low frequency RF source via a first match, an electrostatic chuck being provided on the electrically conductive base, a coupling ring being arranged to surround an outer perimeter of the electrically conductive base, a focus ring being disposed above the coupling ring, the focus ring being arranged to surround the electrostatic chuck and to be exposed to a plasma during a plasma processing procedure; the focus ring being made of a conductor or a semiconductor material;
    an annular electrode that is disposed above the coupling ring;
    further comprising a plurality of wires, a first end of each of the wires being electrically connected to the electrically conductive base, a second end of each of the wires being electrically connected to the annular electrode, a variable impedance device being serially connected on the wire, wherein the plurality of wires are uniformly and symmetrically distributed in an outer peripheral of the base, such that each of the wires and its adjacent wires are spaced with a same distance but connected to different areas of the annular electrode;
    a hermetic baffle plate being provided below the electrically conductive base, the variable impedance device being mounted in a mount space below the hermetic baffle plate and above the reaction chamber bottom wall, wherein the hermetic baffle plate and the bottom wall form an electric field shielding space in atmospheric environment; the variable impedance device comprises a plurality of capacitors having a preset capacitance value and a plurality of switches, wherein switching of the plurality of switches may cause the variable impedance device to have different capacitance values and,
    wherein the low frequency RF source and the first end of the wire are electrically connected to the electrical conductive base but electrically isolated from the hermetic baffle plate.

8. The plasma reactor according to claim 7, wherein a frequency of RF signals outputted by the low frequency RF source is lower than 2 MHz.

9. The plasma reactor according to claim 7, wherein the plurality of capacitors and the plurality of switches are disposed on a PCB circuit board.

10. The plasma reactor according to claim 7, wherein the plurality of capacitors have different capacitance values.

11. The plasma reactor according to claim 7, wherein the plurality of switches are pneumatic switches.

* * * * *